(12) United States Patent
Park et al.

(10) Patent No.: US 12,487,532 B2
(45) Date of Patent: Dec. 2, 2025

(54) EUV COLLECTOR INSPECTION APPARATUS AND INSPECTION METHOD

(71) Applicant: Samsung Electronics Co., Ltd., Suwon-si (KR)

(72) Inventors: Jongbin Park, Gangneung-si (KR); Jeonggil Kim, Hwaseong-si (KR); Matsuda Yozo, Suwon-si (KR); Donghyub Lee, Hwaseong-si (KR); Dohyun Jung, Suwon-si (KR); Yoojin Jeong, Suwon-si (KR); Eunhee Jeang, Hwaseong-si (KR); Wondon Joo, Seoul (KR); Minseok Choi, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 683 days.

(21) Appl. No.: 17/847,477

(22) Filed: Jun. 23, 2022

(65) Prior Publication Data

US 2023/0108698 A1    Apr. 6, 2023

(30) Foreign Application Priority Data

Oct. 1, 2021  (KR) .......................... 10-2021-0131163

(51) Int. Cl.
*G03F 7/00*    (2006.01)

(52) U.S. Cl.
CPC ...... *G03F 7/70591* (2013.01); *G03F 7/70033* (2013.01); *G03F 7/7085* (2013.01); *G03F 7/70908* (2013.01)

(58) Field of Classification Search
CPC ............. G03F 7/70591; G03F 7/70033; G03F 7/7085; G03F 7/70925; G03F 7/70175; G03F 7/70; G03F 7/70008; G03F 7/7015; G03F 7/70483–70541; G03F 7/7055; G03F 7/70558; G03F 7/706; G03F 7/708;
(Continued)

(56) References Cited

U.S. PATENT DOCUMENTS 6,841,322 B1    1/2005    Lee
7,141,798 B2   11/2006    Ito et al.
(Continued)

FOREIGN PATENT DOCUMENTS

JP    2010147138 A    7/2010
KR    102206506 B1    1/2021

*Primary Examiner* — Christina A Riddle
(74) *Attorney, Agent, or Firm* — Wolf, Greenfield & Sacks, P.C.

(57) ABSTRACT

An extreme ultraviolet (EUV) collector inspection apparatus includes a light blocking cover covering a front surface of an EUV collector to be inspected and providing a space portion in which external light is blocked, a light source in the space portion, the light source having a pillar shape extending along a central axis of the EUV collector, the light source configured to output irradiated light ranging from an ultraviolet (UV) band to a visible light (VIS) band, and a spectrometer above the light source and configured to detect a spectrum of reflected light from the irradiated light reflected from the front surface of the EUV collector. The apparatus or a controller associated therewith may be configured to inspect a contamination state of the front surface of the EUV collector based on the spectrum of reflected light.

19 Claims, 15 Drawing Sheets

(58) Field of Classification Search
CPC ............ G03F 7/70808; G03F 7/70825; G03F 7/70841; G03F 7/70858; G03F 7/70883; G03F 7/70908–70941; G03F 7/7095; G03F 7/70958; G03F 7/70975; G03F 7/70991; G01N 21/25; G01N 21/94; G01J 3/00; G01J 3/06; G01J 3/0256; G01J 3/0264; G01J 3/027; G01J 3/0283; G01J 3/0291; G01J 3/02–0202; G01J 3/0218; G01J 3/0221; G01J 3/0216; G01J 3/0237; G01J 3/0254; H05G 2/00–0094

USPC ..... 355/18, 30, 52–55, 67–77; 356/300–334, 356/51; 250/492.1, 492.2, 492.22, 493.1, 250/545.1, 503.1, 504 R, 226

See application file for complete search history.

(56) References Cited

U.S. PATENT DOCUMENTS

| | | | |
|---|---|---|---|
| 7,189,974 B2 | 3/2007 | Kanazawa et al. | |
| 7,760,341 B2 | 7/2010 | Bakshi et al. | |
| 8,536,550 B2 | 9/2013 | Abe et al. | |
| 10,634,623 B2 | 4/2020 | Zhang et al. | |
| 2005/0184248 A1* | 8/2005 | Kanazawa | G21K 1/06 250/372 |
| 2005/0243390 A1 | 11/2005 | Tejnil | |
| 2006/0066824 A1* | 3/2006 | Knappe | G03F 7/70925 355/30 |
| 2006/0097203 A1* | 5/2006 | Bykanov | G03F 7/70925 250/504 R |
| 2009/0159808 A1* | 6/2009 | Bowering | H05G 2/008 427/249.5 |
| 2011/0181868 A1 | 7/2011 | Stokowski | |
| 2012/0127467 A1* | 5/2012 | Ivanov | G01N 21/94 356/326 |
| 2017/0336282 A1 | 11/2017 | Kobayashi et al. | |
| 2022/0309643 A1* | 9/2022 | Lee | G02B 19/0047 |

* cited by examiner

EUV COLLECTOR INSPECTION APPARATUS AND INSPECTION METHOD

CROSS-REFERENCE TO RELATED APPLICATION(S)

This application claims benefit of priority to Korean Patent Application No. 10-2021-0131163 filed on Oct. 1, 2021 in the Korean Intellectual Property Office, the disclosure of which is incorporated herein by reference in its entirety.

BACKGROUND

The present inventive concept relates to an inspection apparatus and an inspection method, and more particularly, to an extreme ultraviolet (EUV) collector inspection apparatus and an inspection method for inspecting contamination of an EUV collector included in an EUV facility.

A laser produced plasma (LPP) type EUV facility may generate EUV light from tin plasma generated by condensing a high-power $CO_2$ laser onto a tin droplet. The EUV light generated from the tin droplet spreads in all directions around the tin droplet, and thus, an EUV collector or a reflector re-focusing the EUV light to a desired location may be essential when using EUV light in a semiconductor exposure process. In the EUV facility, the EUV collector is usually located around the tin droplet to facilitate recollection, and a reflective surface of the EUV collector may be contaminated by various by-products or plasma generated when the tin droplet is vaporized or plasmarized. The EUV collector with a contaminated reflective surface may degrade EUV reflectance, thereby reducing productivity of the EUV equipment.

SUMMARY

An aspect of the present inventive concept is to provide an extreme ultraviolet (EUV) collector inspection apparatus and inspection method capable of precisely inspecting a contamination state of an EUV collector and corresponding EUV reflectance.

According to an aspect of the present inventive concept, an extreme ultraviolet (EUV) collector inspection apparatus includes: a light blocking cover covering a front surface of an EUV collector to be inspected and providing a space portion in which external light is blocked, a light source in the space portion, the light source having a pillar shape extending along a central axis of the EUV collector, the light source configured to output irradiated light ranging from an ultraviolet (UV) band to a visible light (VIS) band, and a spectrometer above the light source and configured to detect a spectrum of reflected light from the irradiated light reflected from the front surface of the EUV collector, wherein the apparatus or a controller associated therewith is configured to inspect a contamination state of the front surface of the EUV collector based on the spectrum of reflected light.

According to another aspect of the present inventive concept, an extreme ultraviolet (EUV) collector inspection apparatus includes: a light blocking cover covering a front surface of an EUV collector to be inspected and providing a space portion in which external light is blocked, a light source in the space portion and configured to output irradiated light ranging from an ultraviolet (UV) band to a visible light (VIS) band, and a spectrometer above the light source and configured to detect a spectrum of reflected light from the irradiated light reflected from the front surface of the EUV collector, wherein the apparatus or a controller associated therewith is configured to inspect a contamination state of the front surface of the EUV collector based on the spectrum of reflected light.

According to another aspect of the present inventive concept, an extreme ultraviolet (EUV) collector inspection apparatus includes: a stage configured to support an EUV collector to be inspected, a light blocking cover configured to cover a front surface of the EUV collector and to provide a space portion in which external light is blocked, a light source in the space portion, the light source having a pillar shape extending along a central axis of the EUV collector, the light source configured to output irradiated light ranging from an ultraviolet (UV) band to a visible light (VIS) band, and a spectrometer above the light source and configured to detect a spectrum of reflected light from the irradiated light reflected from the front surface of the EUV collector, wherein the apparatus or a controller associated therewith is configured to inspect a contamination state of the front surface of the EUV collector based on the spectrum of reflected light.

According to another aspect of the present inventive concept, an extreme ultraviolet (EUV) collector inspection method includes: outputting irradiated light from an ultraviolet (UV) to visible light (VIS) band to a front surface of an EUV collector to be inspected, detecting a spectrum of reflected light from the irradiated light reflected from the front surface of the EUV collector, and comparing the spectrum with a reference spectrum to determine a contaminant deposited on the front surface of the EUV collector.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments of the present inventive concept will be described with reference to the accompanying drawings.

Figure 1:
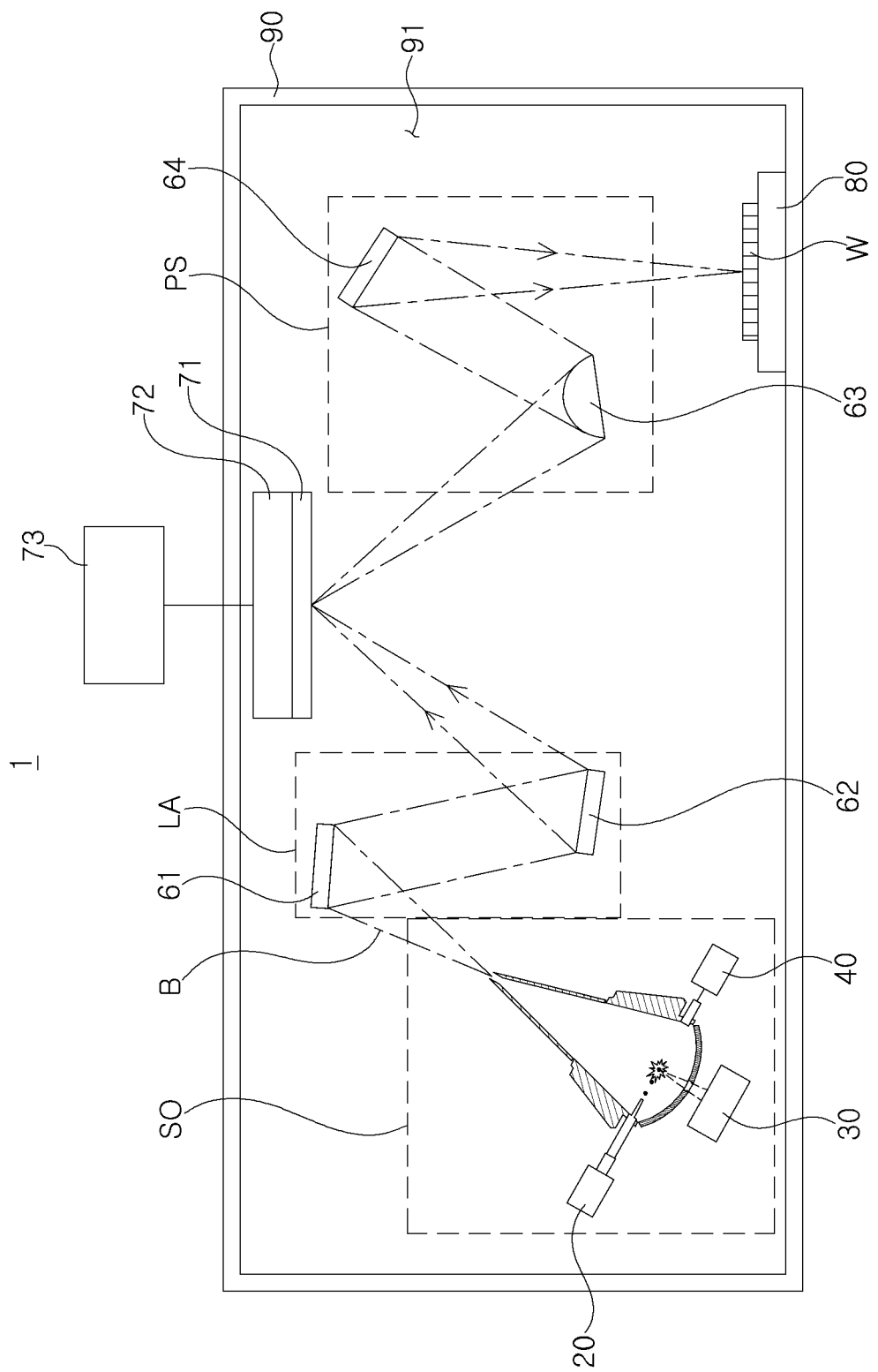
FIG. 1 is a diagram schematically illustrating an extreme ultraviolet (EUV) exposure facility employing an EUV light source system.

An extreme ultraviolet (EUV) light source system and an EUV exposure facility using an EUV collector inspected by an EUV collector inspection apparatus according to an embodiment will be described with reference to FIGS. 1 and 2. FIG. 1 is a diagram schematically illustrating an EUV exposure facility employing an EUV light source system, and FIG. 2 is a diagram schematically illustrating the EUV light source system of FIG. 1.

Referring to FIG. 1, an EUV exposure facility 1 may include an exposure chamber 90, an EUV light source system SO, a lithographic apparatus LA, a projection system PS, an upper electrostatic chuck (ESC) 72, and a lower electrostatic chuck 80.

The exposure chamber 90 may have an internal space 91, in which the EUV light source system SO, the lithographic apparatus LA, the projection system PS, the upper electrostatic chuck 72, and the lower electrostatic chuck 80 may be disposed. A mask 71 may be loaded/unloaded to/from the upper electrostatic chuck 72 by electrostatic force generated by power applied from a power supply or power supply unit 73, and a substrate W such as semiconductor wafer may be loaded/unloaded to/from the lower electrostatic chuck 80.

Figure 2:
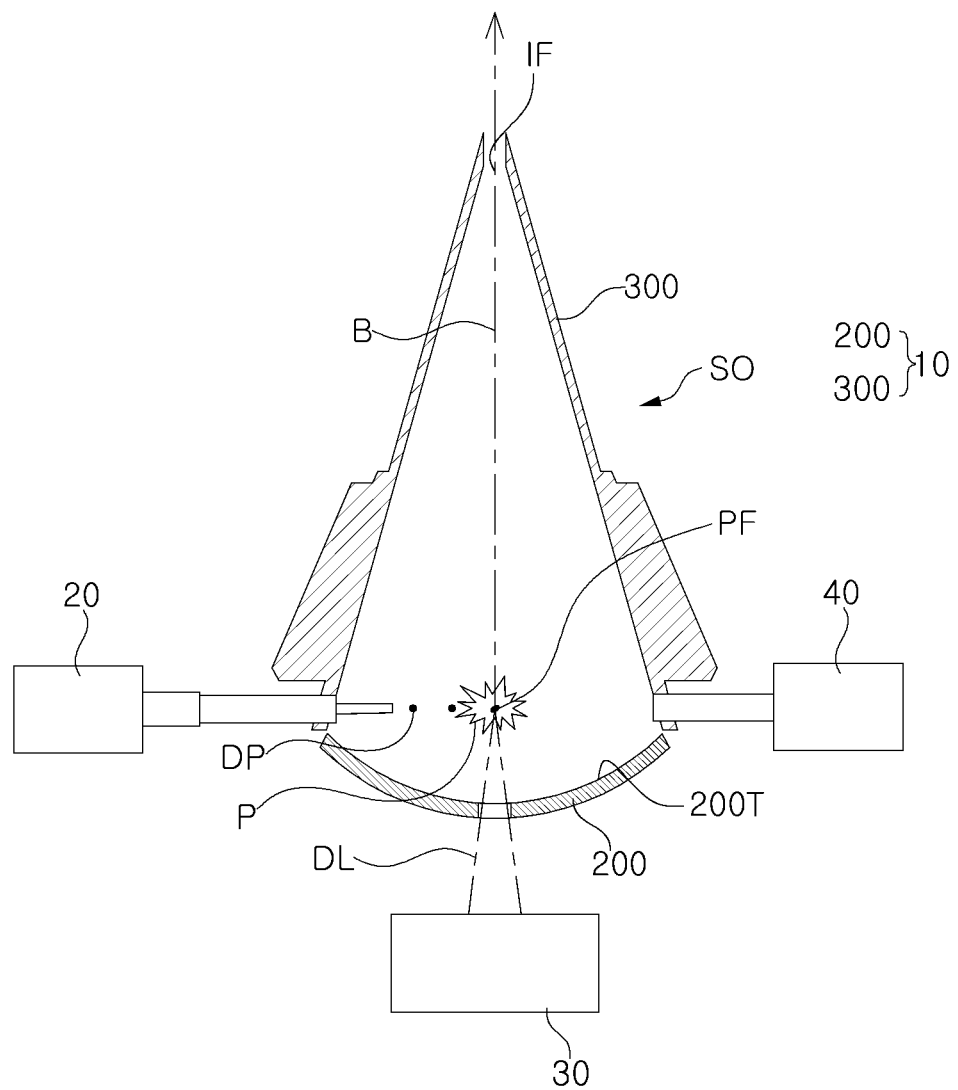
FIG. 2 is a diagram schematically illustrating the EUV light source system of FIG. 1.

Referring to FIG. 2, the EUV light source system SO may generate EUV light B having a wavelength of less about 100 nm. The EUV light source system SO may be a laser-produced plasma (LPP) light source system generating plasma by irradiating a droplet formed of any one of tin (Sn), lithium (Li), and xenon (Xe) with a laser light DL oscillated from a light source or light source unit 30. In addition, in the EUV light source system SO, a so-called master oscillator power amplifier (MOPA) method may be used. That is, the laser light DL irradiated from the light source unit 30 may include a pre-pulse and a main pulse generated using a seed laser. In addition, after the pre-pulse is irradiated to the droplet DP to expand, the main pulse may be re-irradiated to the droplet DP to generate plasma P, and the EUV light B may be emitted using the plasma P. Residues of the droplet DP remaining after irradiation to the main pulse may be accommodated in a catcher 40.

In the light source chamber 10 of the EUV light source system SO, the droplet DP supplied by the droplet supply unit 20 collides with the laser light DL at a primary focus PF to generate the plasma P. The EUV light B emitted from the plasma P may be reflected by an EUV collector 200 to be condensed to an intermediate focus IF. A light condensing principle by the EUV collector 200 follows the law of reflection of an elliptical mirror. That is, light emitted from one focus of the elliptical mirror is reflected by the elliptical mirror and proceeds to another focus of the elliptical mirror. Accordingly, the EUV light B emitted from the primary focus PF may be reflected by the elliptical mirror and travel to the intermediate focus IF so as to be condensed. The EUV light B focused on the intermediate focus IF may be provided to the lithographic apparatus LA. The light source chamber 10 may include the EUV collector 200 in the form of an elliptical mirror that condenses the generated EUV light B and an upper body 300 coupled to the EUV collector 200 and having a conical outer shape. The inside of the light source chamber 10 may be maintained in an ultra-low pressure state to prevent the generated EUV light B from being absorbed by a gas inside the light source chamber 10. A reflective layer for improving reflectivity of EUV light B may be formed on a reflective surface 200T of the EUV collector 200. The reflective layer may include a capping layer formed of zirconium or a multilayer in which molybdenum-silicon (Mo—Si) are cross-stacked. Since the primary focus PF at which the droplet DP and the laser light DL collide is disposed adjacent to the reflective surface 200T of the EUV collector 200, byproducts occurring as the droplet DP is vaporized or plasmarized may contaminate the reflective surface 200T of the EUV collector 200. Such byproducts may be tin or tin oxide. Here, the contamination may include damage to the capping layer or the MO-Si multilayer formed on the reflective surface 200T of the EUV collector 200, as well as deposition of by-products on the reflective surface 200T of the EUV collector 200. When the reflective surface 200T of the EUV collector 200 is contaminated, the reflectance of the EUV collector 200 may decrease. When the reflectance of the EUV collector 200 is reduced, power of the EUV light B may be reduced, and as a result, productivity of the EUV exposure facility 1 may be reduced. Thus, the EUV collector 200 is regularly/irregularly separated from the EUV exposure facility 1 and cleaned.

The lithographic apparatus LA may include a plurality of mirrors to irradiate or reflect the EUV light B emitted from the EUV light source system SO in a direction of the upper electrostatic chuck 72. Since the plurality of mirrors included in the lithographic apparatus LA have a known structure, only two mirrors 61 and 62 are shown for the sake of simplification of the drawing and convenience of description.

The projection system PS may include a plurality of mirrors to project a pattern of EUV light B reflected from the mask 71 attached to the upper electrostatic chuck 72 to the substrate W disposed on the lower electrostatic chuck 80 to expose the pattern on a surface of the substrate W. Since the plurality of mirrors included in the projection system PS have a known structure, only two mirrors 63 and 64 are shown for the sake of simplification of the drawing and convenience of description.

After the EUV collector 200 of the EUV light source system SO is cleaned or before the cleaned EUV collector 200 is mounted to the light source chamber 10, an EUV collector inspection apparatus 100 may be used to determine a surface condition of the EUV collector 200.

Hereinafter, the EUV collector inspection apparatus 100 according to an example embodiment will be described with reference to FIGS. 3 to 5.

Figure 3:
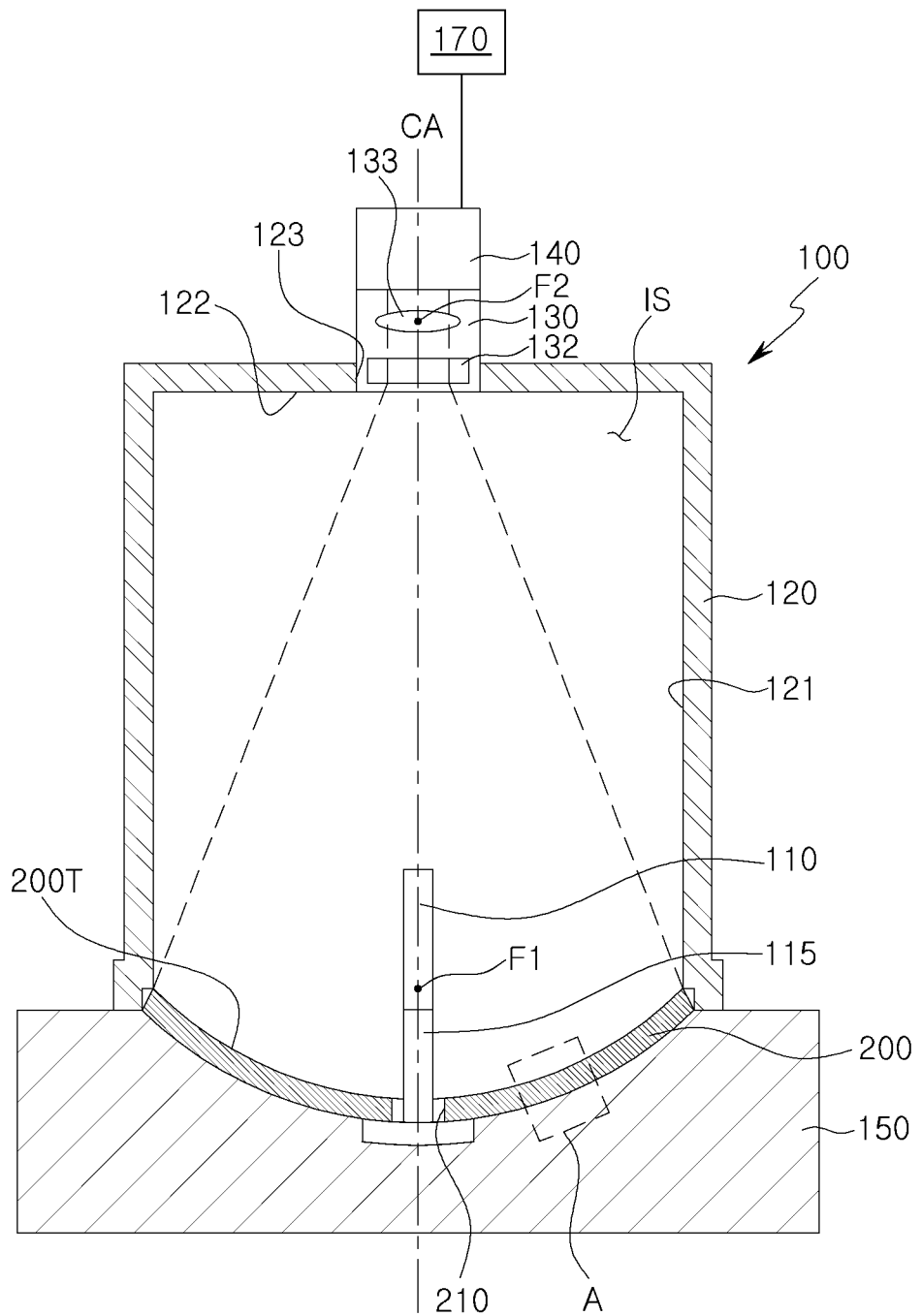
FIG. 3 is a structural diagram schematically illustrating an EUV collector inspection apparatus according to an example embodiment.
Figure 4:
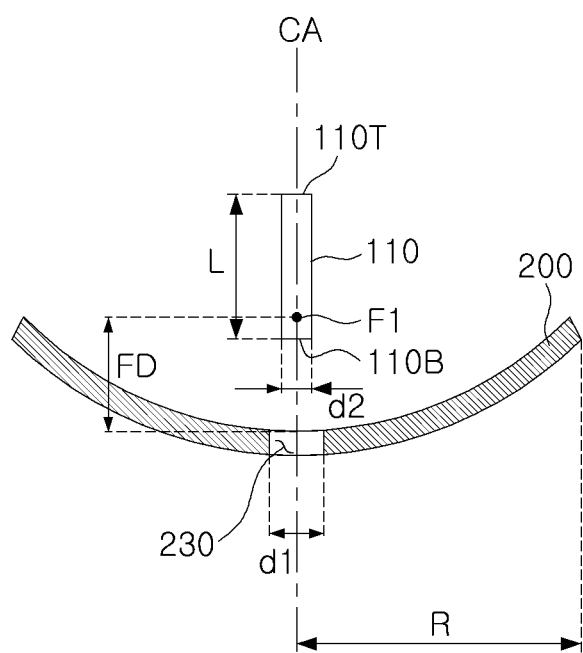
FIG. 4 is a structural diagram schematically illustrating a shape of a light source according to an example embodiment.
Figure 5:
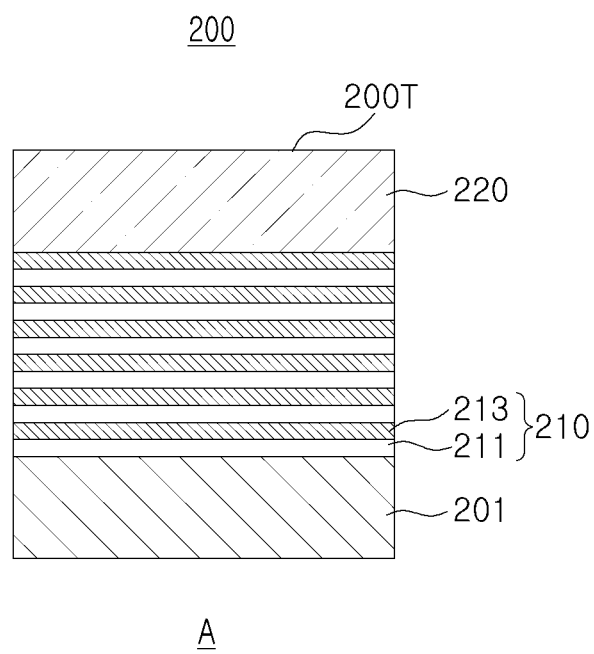
FIG. 5 is a cross-sectional view of an EUV collector of FIG. 3.

Referring to FIGS. 3 to 5, the EUV collector inspection apparatus 100 according to an embodiment may be an apparatus for inspecting a contamination state of the EUV collector 200. The EUV collector inspection apparatus 100 or a controller 170 associated therewith may acquire spectrum data of reflected light reflected from the reflective surface 200T and calculate a contamination state or reflectance of the EUV collector 200 based on the acquired spectrum data. The EUV collector inspection apparatus 100 according to an example embodiment may include a light blocking cover 120, a light source 110, an optical device 130, a spectrometer 140, and a stage 150.

The light blocking cover 120 may cover the reflective surface 200T of the EUV collector 200 to block external light. The light blocking cover 120 may be formed to have a size sufficient to completely cover the reflective surface 200T of the EUV collector 200 and may have a side surface or side wall 121 and an upper surface or upper wall 122. A through-hole 123 to which or through which the optical device 130 is coupled or extends may be formed at the upper surface 122 of the light blocking cover 120. For example, the light blocking cover 120 may be formed in a cylindrical shape with an open lower portion, but is not limited thereto. The light blocking cover 120 may have various forms to cover the EUV collector 200 to form a space portion or inner space IS in which external light is blocked. The light blocking cover 120 may be formed of an aluminum (Al) material having an oxide film formed on a surface thereof, but is not limited thereto, and may be formed of various materials capable of maintaining an external shape while blocking external light. The light blocking cover 120 may have a height at which the optical device 130 coupled to the through-hole 123 of the upper surface 122 may be positioned at the second focal point F2 of the EUV collector 200.

The light source 110 may be disposed in the space portion IS formed by the light blocking cover 120, and may be disposed to be spaced apart from the reflective surface 200T of the EUV collector 200 to be inspected by a predetermined distance. For example, the light source 110 may be disposed at the end of a support rod 115 extending through the EUV collector 200 from the stage 150, so as to be spaced apart from the reflective surface 200T of the EUV collector 200. The light source 110 may output light in the range from an ultraviolet (UV) band to a visible light (VIS) band. For example, the light source 110 may be implemented as a single broadband light source outputting light in the range from the UV band to the VIS band. However, the light source 110 is not limited to a broadband light source. For example, the light source 110 may include at least two light sources that output light having different bands in the range from the UV band to the VIS band. For example, the light source 110 may include a light source emitting light having the UV band and a light source emitting light having the VIS band, respectively.

The light source 110 may be disposed on a central axis CA extending from the center of the EUV collector 200 in the form of an elliptical mirror to the optical device 130.

A shape and arrangement of the light source 110 will be described in detail with reference to FIG. 4. A length L of the light source 110 may be at least greater than an absolute value of a value obtained by subtracting a focal length FD of a first focal point F1 of the EUV collector 200 from a radius R of the EUV collector. That is, the light source 110 may be formed to have a length L that satisfies Equation 1 below. The first focal point F1 of the EUV collector 200 may be a focus point of the elliptical mirror. The first focal point F1 refers to a position corresponding to the primary focus PF described above.

$$L \geq |R - FD| \quad \text{[Equation 1]}$$

A diameter d2 of the light source 110 may be smaller than a diameter d1 of a light transmissive window or opening 230 so that the light source 110 may be inserted through the light transmissive window 230 disposed at the central axis CA of the EUV collector 200.

A lower end 110B of the light source 110 may be disposed to be positioned on a lower level than the first focal point F1 of the EUV collector 200, and an upper end 110T of the light source 110 may be positioned on a level not in contact with the optical device 130 disposed thereabove. Thus, the light source 110 or the upper end 110T thereof may be spaced apart from the optical device 130. The light source 110 may be an elongated member and/or have a pillar or rod shape. The light source 110 may be coupled to the stage 150 through the support rod 115, and may be connected to a wire or an optical fiber in the stage 150.

Referring to FIG. 3, the optical device 130 may be coupled to the through-hole 123 formed in the upper surface 122 of the light blocking cover 120. The optical device 130 may provide an optical path of reflected light reflected from the reflective surface 200T of the EUV collector 200. The optical device 130 may include a lens 133 for condensing the light incident on the spectrometer 140. For example, the lens 133 may be a condensing lens. Also, the lens 133 may be a wide-angle lens capable of condensing reflected light with a wide angle of view. According to an embodiment, the optical device 130 may include a polarizer 132 for polarizing the incident reflected light. In addition, the optical device 130 may include a driving unit for moving the lens 133 in order to adjust an optical axis of the lens 133.

The stage 150 may fix and support the EUV collector 200 to be inspected. For example, the EUV collector 200 may be disposed on an upper surface of the stage 150, and the stage 150 may support and fix a lower surface of the EUV collector 200. The EUV collector 200 may have an elliptical mirror shape, and accordingly, a recess corresponding to an elliptical mirror shape capable of accommodating the EUV collector 200 may be formed on the upper surface of the stage 150. A wire or an optical fiber connected to the light source 110 through the support rod 115 may be disposed inside the stage 150. Power may be applied to the light source 110 through a wire and the light source 110 may emit light when power is applied thereto. Also, as for the light source 110, external light may be transmitted through an optical fiber.

Meanwhile, the stage 150 may be a three-dimensional moving stage that may move in three dimensions. As the stage 150 moves, the EUV collector 200 may also move. For example, by moving the stage 150, focusing on the z-axis and/or movement on an x-y plane of the EUV collector 200 may be performed. Here, the z-axis corresponds to a vertical plane of the stage 150 or a normal perpendicular to a plane in contact with a center portion of the EUV collector 200, and the x-y plane may correspond to a horizontal plane of the stage 150 or a plane perpendicular to the z-axis.

FIG. 5 is a cross-sectional view illustrating a cross-sectional structure of the EUV collector 200 to be inspected.

Referring to FIG. 5, the EUV collector 200 may include a substrate 201, a Mo—Si multilayer 210, and a capping layer 220. The substrate 201 may be formed of a low thermal expansion material (LTEM). For example, the substrate 201 may be formed of silicon or quartz. However, a material of the substrate 201 is not limited thereto.

The Mo—Si multilayer 210 may be formed on the substrate 201 and include a plurality of silicon (Si) layers 211 and molybdenum (Mo) layers 213 alternately stacked to maximize EUV reflection. For example, the Mo—Si multilayer 210 may be configured by stacking about 40 to about 100 bilayers of the silicon layer 211 and the molybdenum layer 213. In addition, each of the silicon layer 211 and the molybdenum layer 213 constituting the Mo—Si multilayer 210 may have a thickness of about 2 nm to 5 nm. However, the number of stacked bilayers and the thickness of each of the silicon layer 211 and the molybdenum layer 213 are not limited to the above numerical values.

The capping layer 220 may be formed on the Mo—Si multilayer 210. The capping layer 220 may be formed of at least one material layer, and may protect the Mo—Si multilayer 210. For example, the capping layer 220 may be formed of ruthenium (Ru) and have a thickness of about 5 to 10 nm. However, a material of the capping layer 220 is not limited to ruthenium. Also, the thickness of the capping layer 220 is not limited to the above numerical values.

Meanwhile, the structure of the EUV collector 200 is not limited to the structure of FIG. 5. In addition, the material of each layer constituting the EUV collector 200 is not limited to the materials described above. For example, the EUV collector 200 may be formed of various structures and materials capable of maximizing reflection of EUV. In addition, since the EUV collector 200 needs to reflect EUV in a plasma environment, the EUV collector 200 may be formed of a material that may minimize damage due to plasma.

As described above, in the light source chamber 10, contamination of the EUV collector 200 may be largely classified as follows. One is a case in which a plasma byproduct, for example, tin or tin oxide is deposited on the capping layer 220, and the other is a case in which the capping layer 220 and/or the Mo—Si multilayer 210 is damaged by plasma. Both contaminations may affect the EUV reflectivity of the EUV collector 200.

The spectrometer 140 may be disposed at a rear end of the optical device 130 and may receive reflected light through the optical device 130 and detect a spectrum of the emitted light. The EUV collector inspection apparatus 100 or the controller 170 may analyze a spectrum output through the spectrometer 140 to determine a type of plasma byproduct deposited on the EUV collector 200. In addition, the EUV collector inspection apparatus 100 may determine a case in which the capping layer 220 and/or the Mo—Si multilayer 210 of the EUV collector 200 is damaged. This will be described in detail with reference to FIGS. 6 to 8.

Figure 6A:
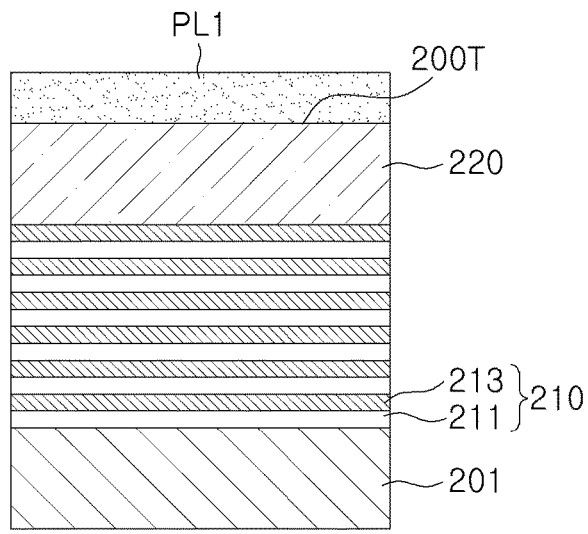
FIGS. 6A and 6B are diagrams illustrating a contaminant deposited on a reflective surface of an EUV collector.
Figure 6B:
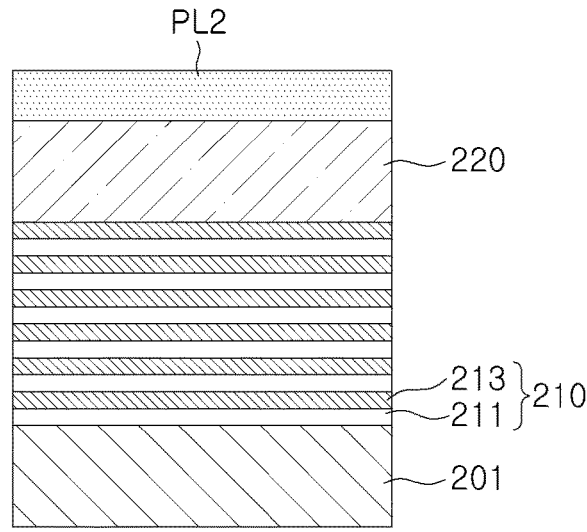
Figure 6C:
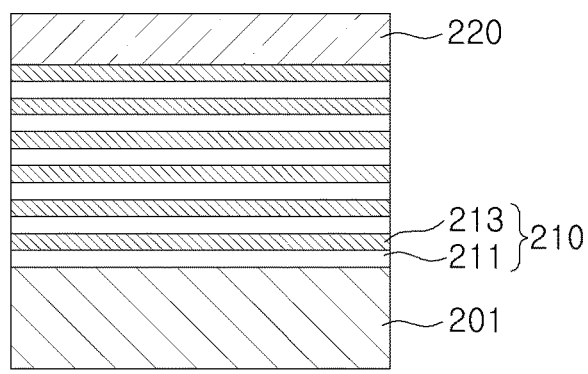
FIGS. 6C and 6D are diagrams illustrating a damaged reflective surface of an EUV collector.
Figure 6D:
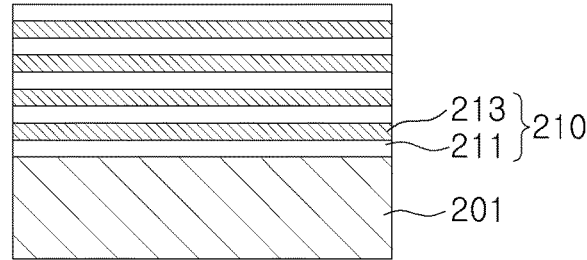
Figure 7:
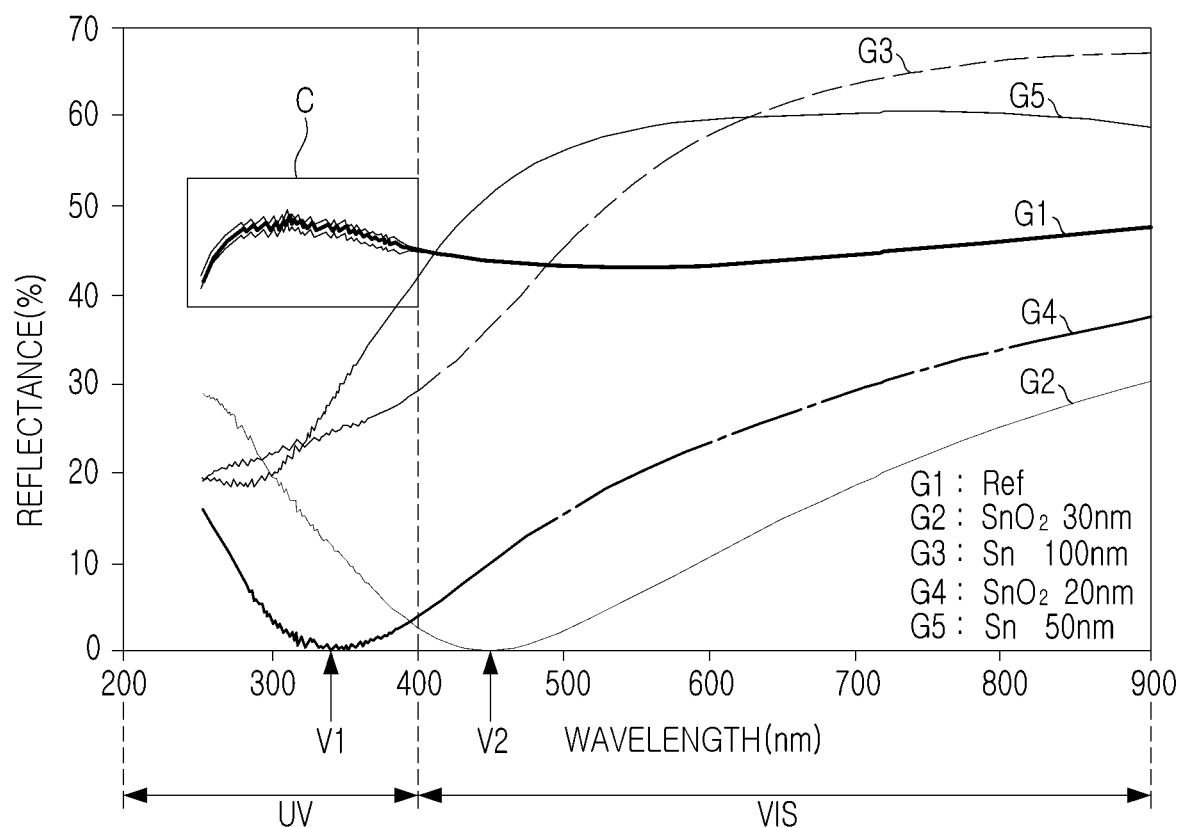
FIG. 7 is a graph illustrating a spectrum of light measured by a spectrometer.

FIGS. 6A and 6B are views illustrating a contaminant deposited on the reflective surface 200T of the EUV collector 200, and FIGS. 6C and 6D are views illustrating a damaged the reflective surface 200T of the EUV collector 200. FIG. 7 is a graph illustrating a spectrum measured by the spectrometer 140, and FIG. 8 is an enlarged view of portion C of FIG. 7.

FIG. 6A is a case in which a contamination layer PL1 formed of tin is formed on the reflective surface 200T of the EUV collector 200, and FIG. 6B is a case in which a contamination layer PL2 formed of a tin oxide is formed on the reflective surface 200T of the EUV collector 200. FIG. 6C is a case in which the capping layer 220 is partially damaged and a thickness is reduced, and FIG. 6D is a case in which the capping layer 222 is entirely removed and a portion of the Mo—Si multilayer 210 is damaged.

FIG. 7 is a graph illustrating spectra measured at the reflective surface 200T of the EUV collector 200 in the case of FIGS. 6A to 6D. G1 of FIG. 7 is a graph of a reference spectrum, which is a spectrum measured at the reflective surface 200T of the EUV collector 200 which is not damaged. G3 and G5 are spectra measured when tin is deposited on the reflective surface 200T of the EUV collector 200. G2 and G4 are spectra measured when tin oxide is deposited on the reflective surface 200T of the EUV collector 200. As shown in FIG. 7, G1 has a uniform reflectance value over a UV-VIS band overall, but G3 and G5 show a trend that the reflectance gradually increases in the UV-VIS band. Meanwhile, G2 and G4 have valley regions V1 and V2 that decrease in the UV-VIS band. Since the by-product deposited on the reflective surface 200T of the EUV collector 200 is tin or tin oxide, the measured spectrum is expressed as the sum of these unit spectra. Accordingly, a type of a byproduct deposited on the reflective surface 200T of the EUV collector 200 may be identified by measuring spectra measured from the reflective surface 200T of the EUV collector 200 on which a contamination layer of tin or tin oxide is formed according to thicknesses and types of the contamination layer, forming a database thereof, and reversely calculating unit spectra from the spectra measured from the reflective surface 200T of the EUV collector 200 to be inspected based on the database.

Figure 8:
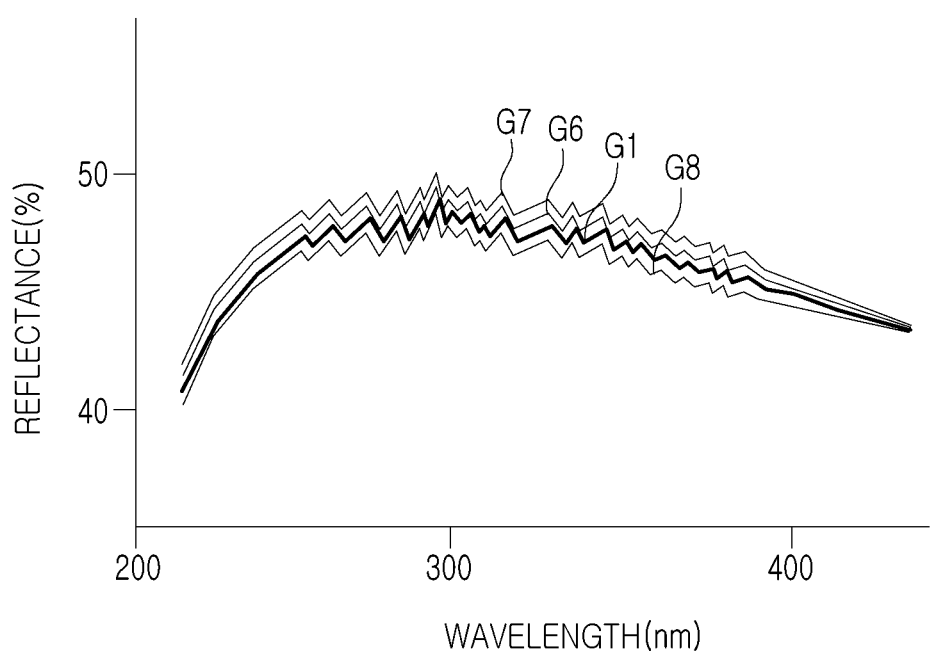
FIG. 8 is an enlarged view of portion C of FIG. 7.

Also, referring to FIG. 8, spectra G6 and G7 have a reflectance which is similar to that of the reference spectrum G1 but slightly increases overall and spectrum G8 has a reflectance which is similar to that of the reference spectrum G1 but slightly decreases overall. The case in which the reflectance slightly increases may be regarded as a case in which the capping layer 222 and/or the Mo—Si multilayer 210 are damaged. The case in which the reflectance slightly decreases may be regarded as a case in which a crack occurs in the capping layer 222. Accordingly, a surface state of the reflective surface 200T of the EUV collector 200 may be identified by analyzing the spectrum of the reflected light of the EUV collector 200.

Therefore, by analyzing the spectrum of the reflected light of the EUV collector 200, the type of by-product deposited on the reflective surface 200T of the EUV collector 200 and the surface state of the EUV collector 200 may be identified.

Various modified examples of the EUV collector inspection apparatus according to an embodiment will be described with reference to FIGS. 9 to 14. A description of the same configuration as that of the EUV collector inspection apparatus 100 of FIG. 3 described above may be omitted in the interest of brevity, and differences will be mainly described.

Figure 9:
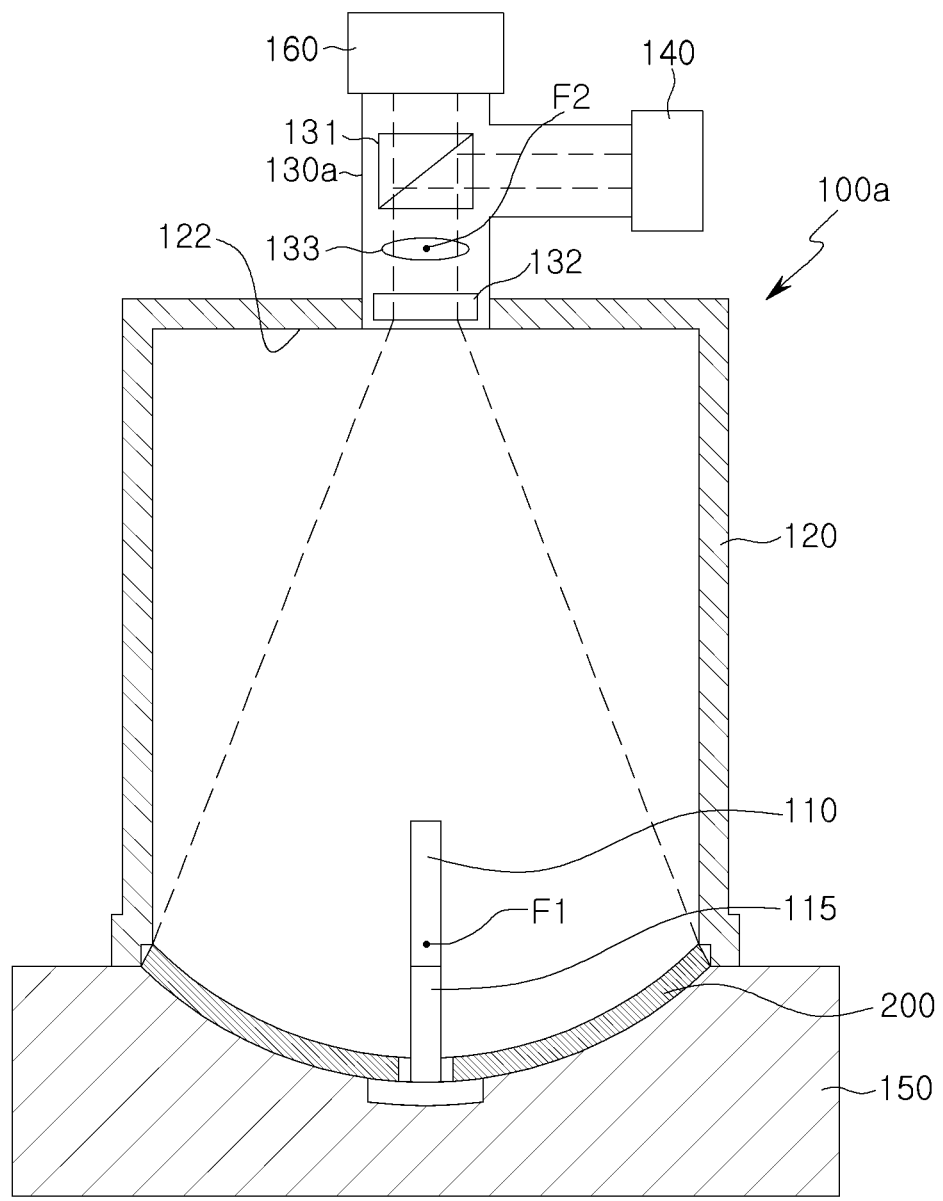
FIGS. 9 to 14 are various modified examples of an EUV collector inspection apparatus according to example embodiments.
Figure 10:
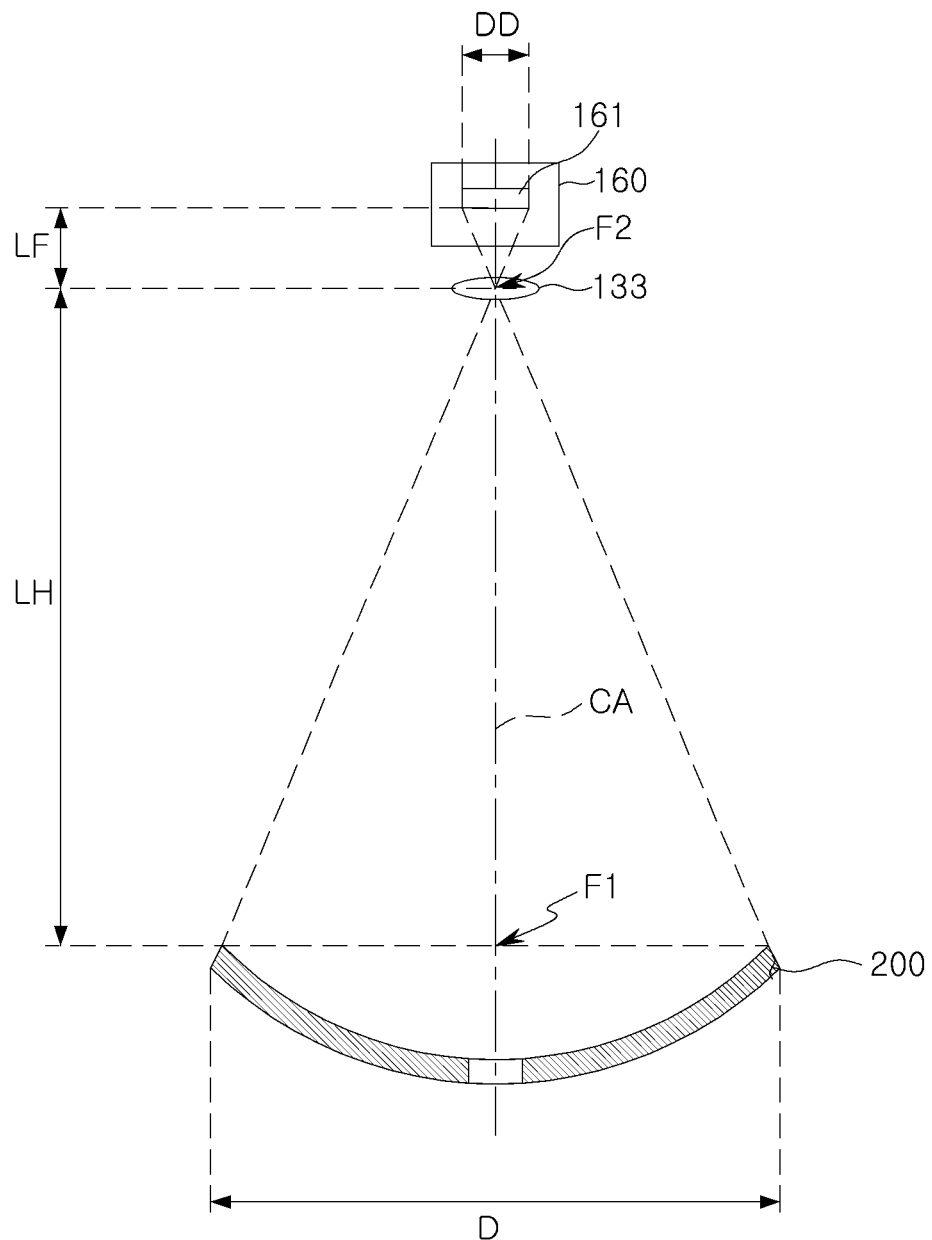

An EUV collector inspection apparatus 100a of FIG. 9 further includes a beam splitter 131 splitting reflected light incident on an optical device 130a. A camera 160 for imaging reflected light may be further disposed at one end of the optical device 130a. The reflected light split by the beam splitter 131 may be incident on each of the spectrometer 140 and the camera 160. The camera 160 may be a high-sensitivity camera capable of forming an image corresponding to a wavelength band of the light source 110. For example, the camera 160 may perform imaging on reflected light from a UV band to a VIS band. The camera 160 may be disposed in consideration of a focal position of the EUV collector 200. Referring to FIG. 10, a width DD of an image sensor 161 of the camera 160 may have a relationship as in Equation 2 below. LF is a distance between the lens 133 disposed at the second focal point F2 and the image sensor 161. LH is a distance between the lens 133 and the first focal point F1, and D is a size of a diameter of the EUV collector 200.

$$DD:LF=D:LH \qquad \text{[Equation 2]}$$

Figure 11:
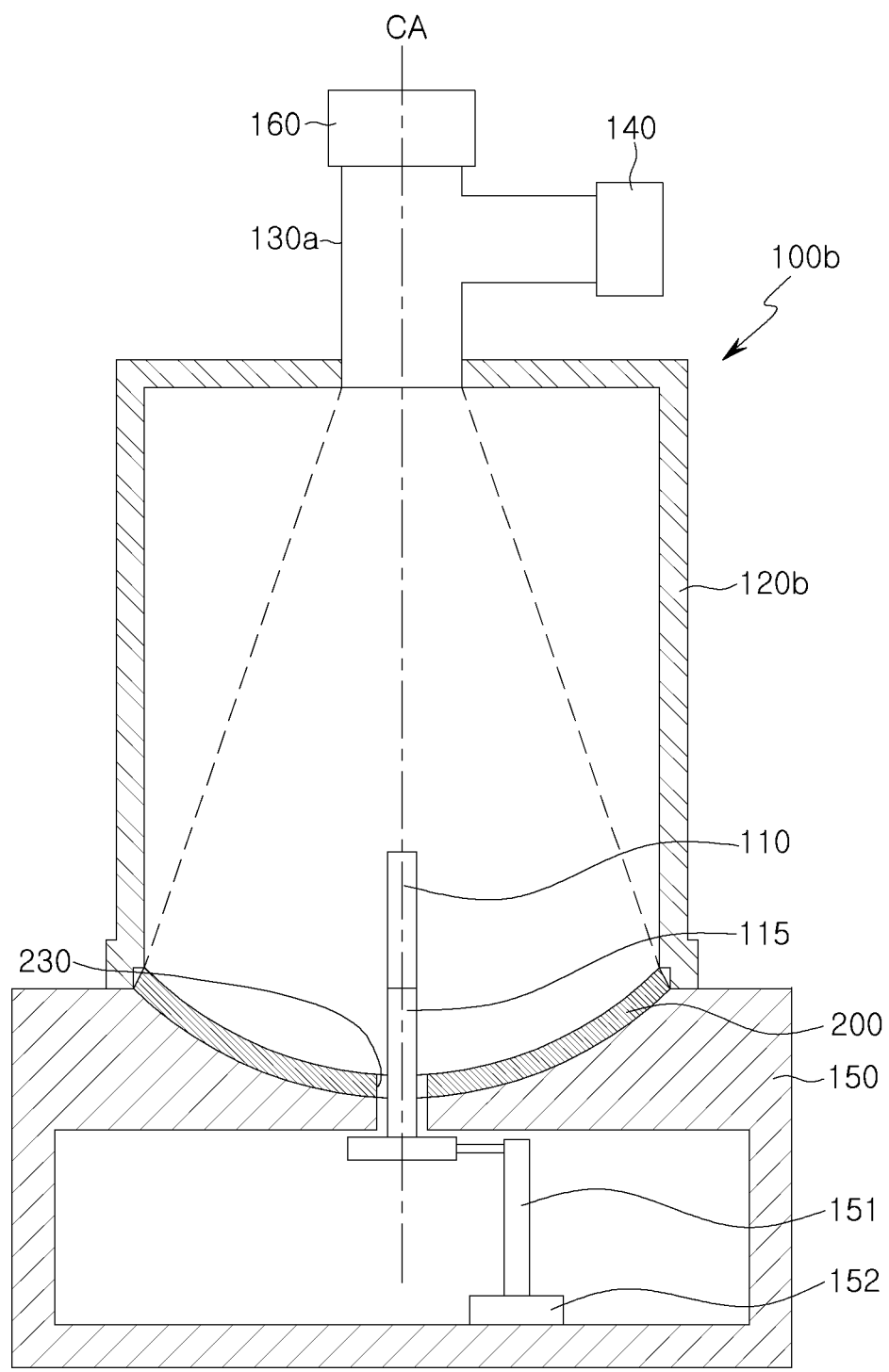

In the EUV collector inspection apparatus 100b of FIG. 11, a driving unit 152 is disposed on the stage 150, and the support rod 115 connected to a driving shaft 151 of the driving unit 152 may be moved up and down by the driving unit 152. Accordingly, the light source 110 attached to the support rod 115 may be automatically inserted through the light transmissive window 230 of the EUV collector 200 according to the driving of the driving unit 152. Through this, inspection of the EUV collector 200 may be automated.

Figure 12:
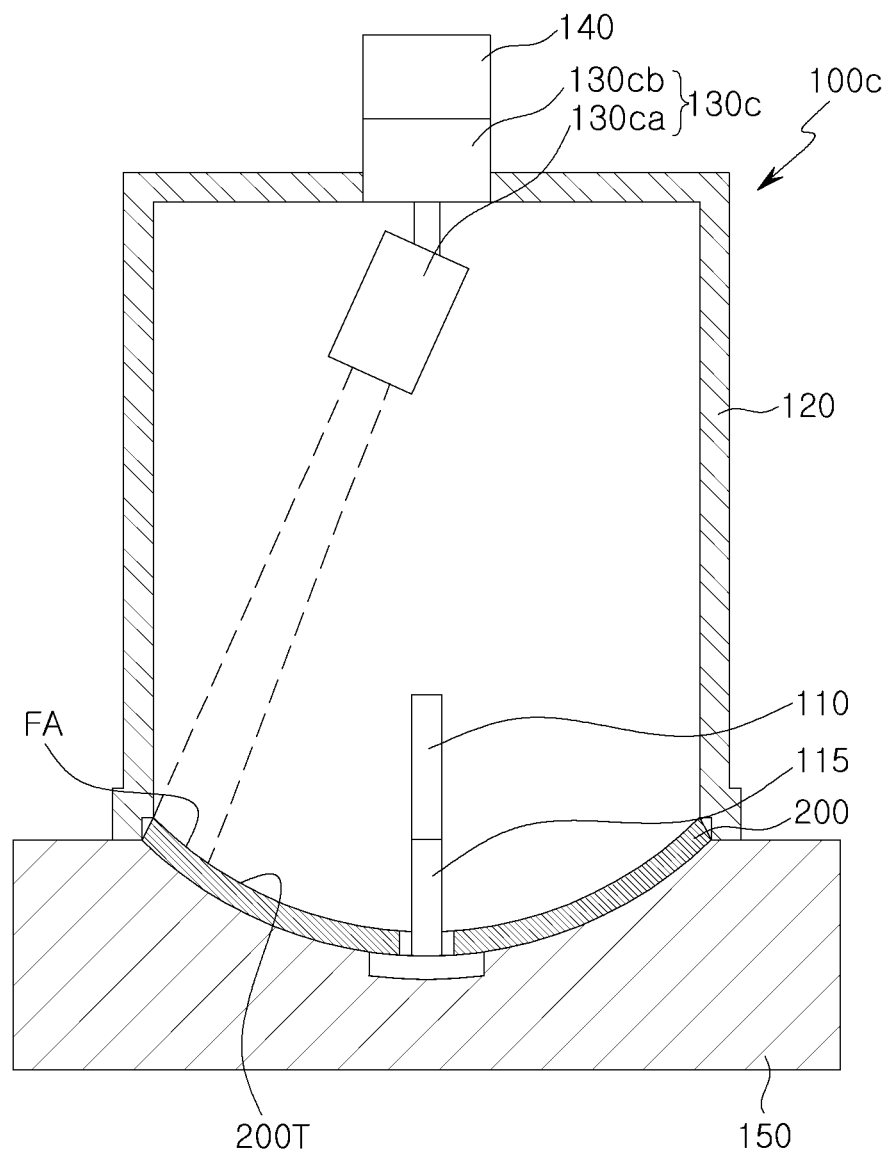

An EUV collector inspection apparatus 100c of FIG. 12 is an example in which an optical device 130c includes a driving unit 130cb and a lens unit 130ca. The lens unit 130ca may be moved while scanning the reflective surface 200T of the EUV collector 200 in units of a small area FA by the driving unit 130cb. Accordingly, as the lens unit 130ca moves, the spectrometer 140 may sequentially detect spectra measured at each region of the reflective surface 200T of the EUV collector 200. In this manner, since the reflective surface 200T of the EUV collector 200 is divided into a plurality of regions and the spectrum of each region may be measured, a position of a by-product deposited on the reflective surface 200T of the EUV collector 200 may be detected.

Figure 13:
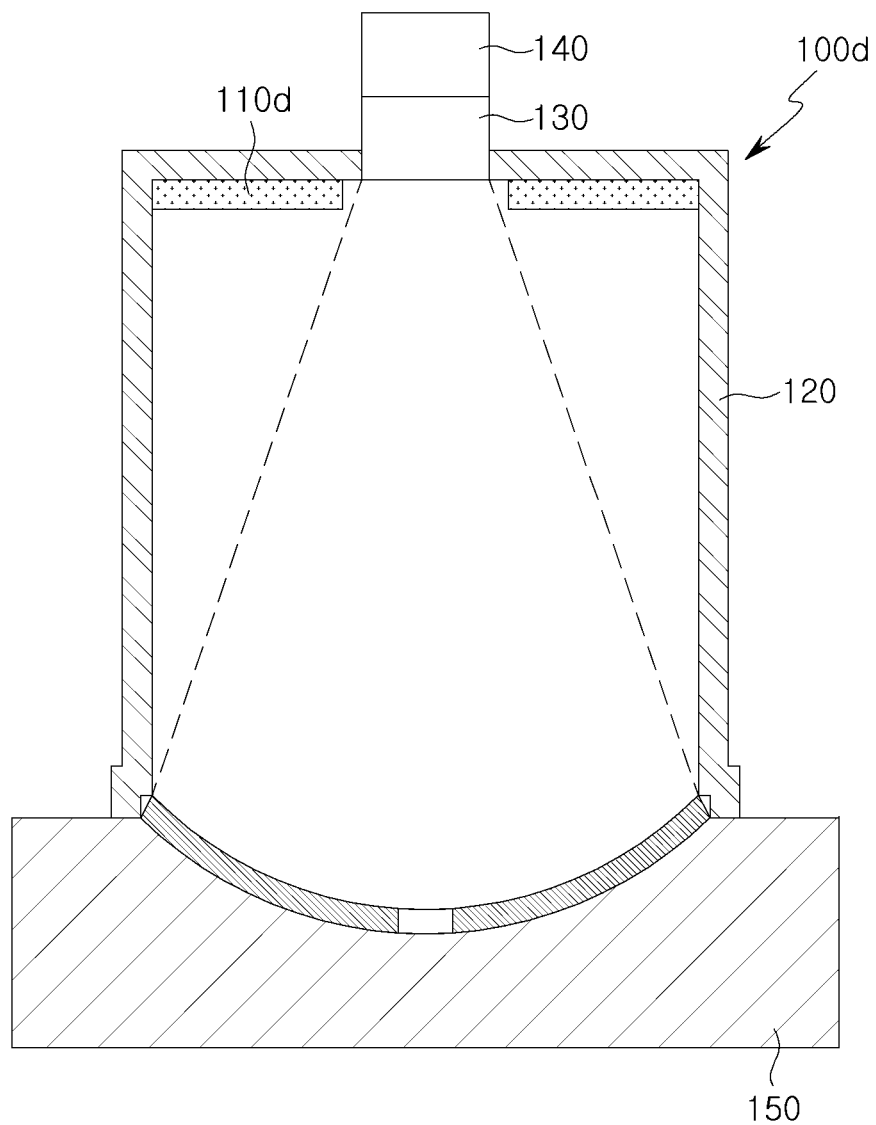

An EUV collector inspection apparatus 100d of FIG. 13 is an example in which a light source 110d is disposed on an upper surface or upper wall of the light blocking cover 120.

In this case, there is an advantage in that scattered light may be uniformly irradiated to the reflective surface 200T of the EUV collector 200.

Figure 14:
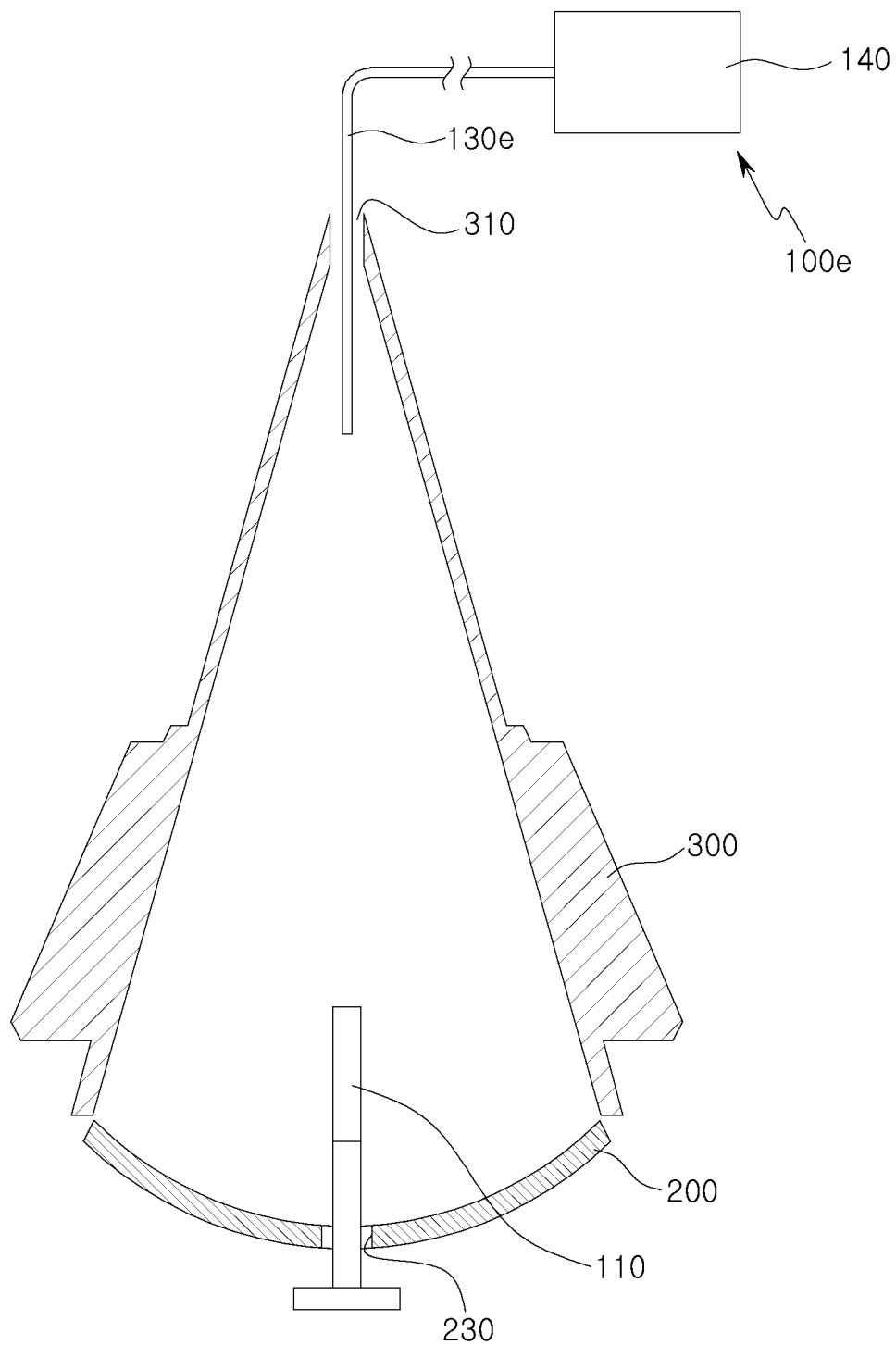

An EUV collector inspection apparatus 100e of FIG. 14 is an example in which an optical device 130e is an optical cable and an upper body 300 of a light source chamber 10 is used as a light blocking cover. The optical device 130e, which is an optical cable, may be inserted through a through-hole 310 located at the intermediate focus IF of the upper body 300, and the light source 110 may be inserted through the light transmissive window 230 of the EUV collector 200. Therefore, the reflection surface 200T of the EUV collector 200 may be measured in a state in which the EUV collector 200 is coupled to the upper body 300. Accordingly, there is an advantage in that the EUV collector 200 may be measured without being separated from the light source chamber 10.

Figure 15:
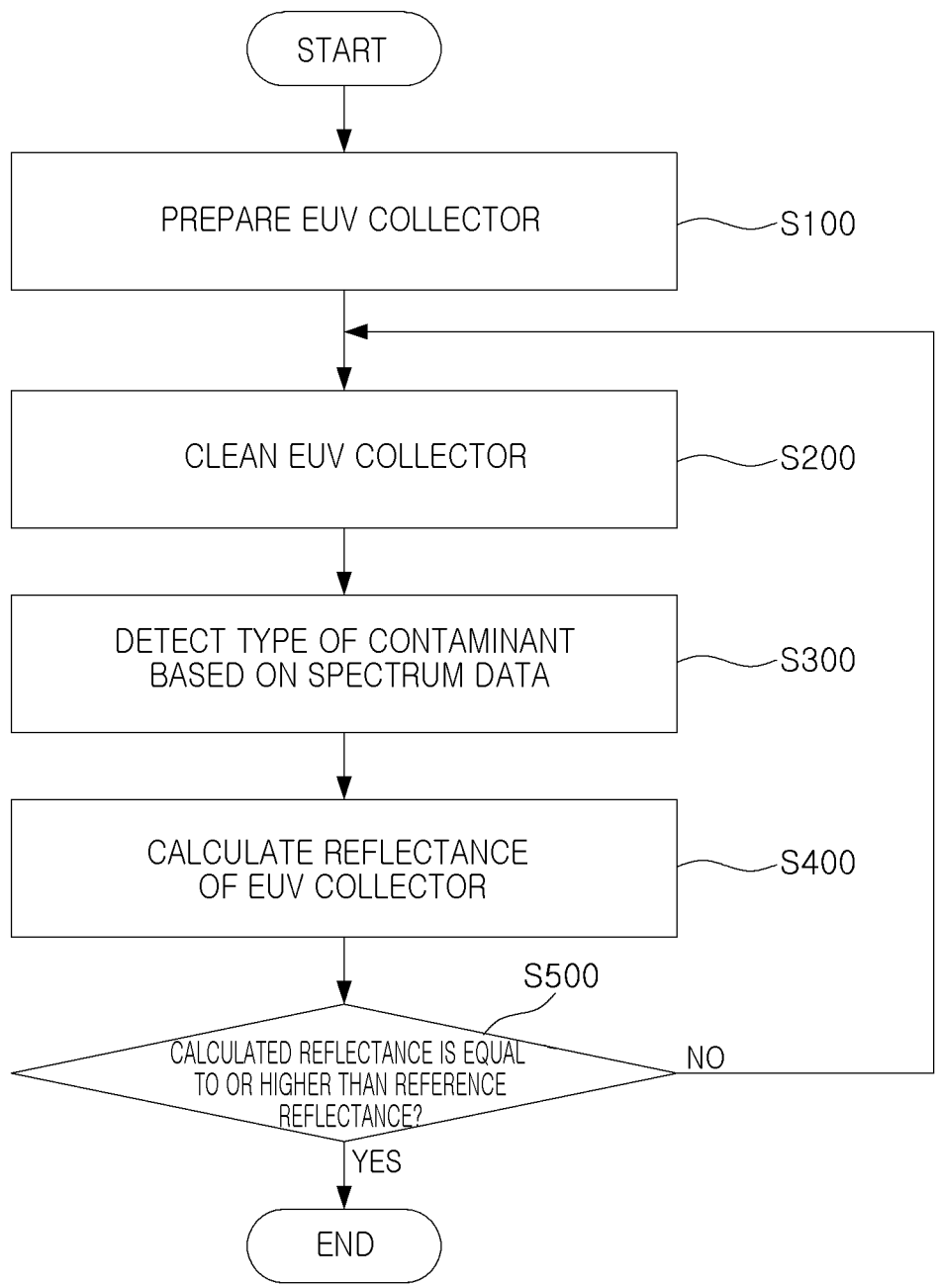
FIG. 15 is a flowchart illustrating an EUV collector inspection method according to an embodiment of the present inventive concept.

An EUV collector inspection method according to an embodiment of the present inventive concept will be described with reference to FIG. 15. FIG. 15 is a flowchart illustrating an EUV collector inspection method. A description is provided with reference to FIG. 3, and the content already described in the description part of FIG. 3 may be briefly described or omitted in the interest of brevity.

Referring to FIG. 15, in the EUV collector inspection method of the present embodiment, first, the EUV collector 200 to be inspected is prepared (S100). Here, the EUV collector 200 may be a contaminated EUV collector which has been used for a preset period of time or longer during an EUV exposure process of an EUV facility. The EUV collector 200 may be separated from the corresponding EUV facility and prepared for cleaning.

Next, the EUV collector 200 is cleaned in a cleaning device (S200). For example, the EUV collector 200 may be cleaned by a snow jet that sprays $CO_2$ in the cleaning device.

After the EUV collector 200 is cleaned, a type of by-product deposited on the EUV collector 200 may be detected based on the spectrum of reflected light of the UV-VIS band (S300). More specifically, the EUV collector 200 may be disposed on the stage 150 of the EUV collector inspection apparatus 100 and the light source 110 may output light having the UV-VIS band. In addition, in response to light having the UV-VIS band, the spectrometer 140 may detect a continuous spectrum in the UV-VIS band. Thereafter, the type of the by-product deposited on the EUV collector 200 may be detected based on the detected spectrum of the UV-VIS band. Thereafter, reflectance of the EUV collector 200 may be calculated based on the type of the detected by-product (S400). For example, the reflectance of the EUV collector 200 may be calculated by detecting a loss value of the reflectance from the type of by-product. A loss rate of reflectance may be calculated by referring to a database including reflectance measured according to the type of by-product. Such a database may be prepared in advance.

After the reflectance of the EUV collector 200 is calculated, whether the calculated reflectance is equal to or greater than the reference reflectance may be determined (S500). The reference reflectance may correspond to, for example, a minimum EUV reflectance of the EUV collector 200 that may be used in an EUV exposure facility.

If the calculated reflectance is less than the reference reflectance (No), the process may move to the operation of cleaning the EUV collector 200 (S200), and then operations S200 to S500 may be repeated.

Meanwhile, according to an embodiment, when the calculated reflectance is equal to or greater than the reference reflectance (Yes), the EUV collector 200 inspection procedure may be terminated.

The EUV collector inspection apparatus according to the present inventive concept may precisely inspect a contaminant deposited on the reflective surface of the EUV collector and an EUV reflectance.

The EUV collector inspection method according to the present inventive concept may precisely inspect a contaminant deposited on the reflective surface of the EUV collector and an EUV reflectance.

While example embodiments have been shown and described above, it will be apparent to those skilled in the art that modifications and variations could be made without departing from the scope of the present inventive concept as defined by the appended claims.

What is claimed is:

1. An extreme ultraviolet (EUV) collector inspection apparatus comprising:
   a light blocking cover covering a front surface of an EUV collector to be inspected and providing a space portion in which external light is blocked;
   a light source in the space portion, the light source having a pillar shape extending along a central axis of the EUV collector, the light source configured to output irradiated light ranging from an ultraviolet (UV) band to a visible light (VIS) band; and
   a spectrometer above the light source and configured to detect a spectrum of reflected light from the irradiated light reflected from the front surface of the EUV collector,
   wherein the apparatus or a controller associated therewith is configured to inspect a contamination state of the front surface of the EUV collector based on the spectrum of reflected light.

2. The EUV collector inspection apparatus of claim 1, wherein
   the apparatus or the controller associated therewith is configured to calculate a contaminant deposited on the front surface of the EUV collector based on the spectrum of reflected light, and to calculate reflectance of the EUV collector based on a type of the contaminant.

3. The EUV collector inspection apparatus of claim 2, wherein
   the EUV collector is configured to condense EUV light from a plasma-based EUV generating device and output the condensed EUV light and has an elliptical mirror shape having a first focal point and a second focal point at the central axis, and
   the light source is disposed at the first focal point of the EUV collector.

4. The EUV collector inspection apparatus of claim 3, wherein the EUV collector comprises a light transmissive window at the central axis, and the light source extends to the space portion through the light transmissive window.

5. The EUV collector inspection apparatus of claim 2, further comprising an optical device configured to provide an optical path of the reflected light,
   wherein the light blocking cover comprises a through-hole in a region corresponding to the central axis, and the optical device is coupled to the through-hole.

6. The EUV collector inspection apparatus of claim 5, wherein the optical device further includes a lens unit configured to condense the reflected light.

7. The EUV collector inspection apparatus of claim 6, wherein
the optical device further comprises a driving unit connected to the lens unit and configured to adjust an optical axis of the lens unit, and
the lens unit is configured to scan the front surface of the EUV collector in response to the driving unit driving the lens unit.

8. The EUV collector inspection apparatus of claim 5, wherein the optical device comprises an optical cable.

9. The EUV collector inspection apparatus of claim 5, wherein the optical device further comprises a polarizer disposed on the optical path and configured to polarize the reflected light.

10. The EUV collector inspection apparatus of claim 5, further comprising a camera connected to the optical device and configured to capture an image of the EUV collector output through the optical device.

11. The EUV collector inspection apparatus of claim 10, wherein the camera is disposed on the central axis.

12. The EUV collector inspection apparatus of claim 10, wherein the apparatus or the controller associated therewith is configured to detect a position of the EUV collector in which the contaminant is deposited based on the image.

13. An extreme ultraviolet (EUV) collector inspection apparatus comprising:
a light blocking cover covering a front surface of an EUV collector to be inspected and providing a space portion in which external light is blocked;
a light source in the space portion and configured to output irradiated light ranging from an ultraviolet (UV) band to a visible light (VIS) band; and
a spectrometer above the light source and configured to detect a spectrum of reflected light from the irradiated light reflected from the front surface of the EUV collector,
wherein the apparatus or a controller associated therewith is configured to inspect a contamination state of the front surface of the EUV collector based on the spectrum of reflected light, and
wherein the light source comprises an elongated member extending along a central axis of the EUV collector.

14. The EUV collector inspection apparatus of claim 13, wherein
the EUV collector is configured to condense EUV light from a plasma-based EUV generating device and to output the condensed EUV light and has an elliptical mirror shape having a first focal point and a second focal point at the central axis, and
the light source is positioned at the first focal point of the EUV collector.

15. The EUV collector inspection apparatus of claim 13, wherein
the light blocking cover has a cylindrical shape having an upper surface above the front surface of the EUV collector and a side surface extending downwardly from the upper surface, and
the light source is on the upper surface.

16. An extreme ultraviolet (EUV) collector inspection apparatus comprising:
a stage configured to support an EUV collector to be inspected;
a light blocking cover configured to cover a front surface of the EUV collector and to provide a space portion in which external light is blocked;
a light source in the space portion, the light source having a pillar shape extending along a central axis of the EUV collector, the light source configured to output irradiated light ranging from an ultraviolet (UV) band to a visible light (VIS) band; and
a spectrometer above the light source and configured to detect a spectrum of reflected light from the irradiated light reflected from the front surface of the EUV collector,
wherein the apparatus or a controller associated therewith is configured to inspect a contamination state of the front surface of the EUV collector based on the spectrum of reflected light.

17. The EUV collector inspection apparatus of claim 16, wherein the EUV collector comprises a light transmissive window at the central axis, and the light source extends to the space portion through the light transmissive window.

18. The EUV collector inspection apparatus of claim 16, wherein
the EUV collector includes a substrate, a Mo-Si multilayer on the substrate, and a capping layer on the Mo-Si multilayer, and
the apparatus or the controller associated therewith is configured to detect a type of a contaminant deposited on the capping layer or whether the capping layer and the Mo-Si multilayer is damaged based on the spectrum of reflected light.

19. The EUV collector inspection apparatus of claim 16, wherein a wavelength angular resolution of the spectrometer is 0.1 nm to 50 nm.

* * * * *